(12) United States Patent
Norton et al.

(10) Patent No.: US 10,820,442 B2
(45) Date of Patent: Oct. 27, 2020

(54) MODULAR SERVER ARCHITECTURES

(71) Applicant: HEWLETT PACKARD ENTERPRISE DEVELOPMENT LP, Houston, TX (US)

(72) Inventors: John Norton, Houston, TX (US); Hermann Wienchol, Houston, TX (US); David Engler, Cypress, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 48 days.

(21) Appl. No.: 16/000,791

(22) Filed: Jun. 5, 2018

(65) Prior Publication Data

US 2019/0373754 A1    Dec. 5, 2019

(51) Int. Cl.
*G06F 7/14* (2006.01)
*H05K 7/14* (2006.01)
*G06F 3/06* (2006.01)
*G06F 13/38* (2006.01)

(52) U.S. Cl.
CPC ......... *H05K 7/1422* (2013.01); *H05K 7/1487* (2013.01); *H05K 7/1491* (2013.01)

(58) Field of Classification Search
None
See application file for complete search history.

(56) References Cited

U.S. PATENT DOCUMENTS

| 7,210,586 | B2 | 5/2007 | Ice |
| 7,639,486 | B2 | 12/2009 | Champion et al. |
| 8,614,890 | B2 | 12/2013 | Hensley et al. |
| 9,894,810 | B2 | 2/2018 | Gauthier et al. |
| 2012/0069514 | A1* | 3/2012 | Ross ................ H05K 7/20727 361/679.33 |
| 2015/0039871 | A1* | 2/2015 | Shetty ................ G06F 9/5011 713/1 |
| 2017/0123476 | A1* | 5/2017 | Engler ................ G11C 5/141 |

FOREIGN PATENT DOCUMENTS

WO    WO-9325968 A1    12/1993

* cited by examiner

*Primary Examiner* — Scott C Sun
(74) *Attorney, Agent, or Firm* — Hewlett Packard Enterprise Patent Department

(57) ABSTRACT

Examples relate to a modular server architecture that comprises a server chassis, a plurality of independent resource modules releasable attached to the server chassis a memory semantic protocol controller connected to the plurality of independent resource modules. Each one of the resource modules of the plurality of resource modules has a distinct Printed Circuit Board (PCB). The memory semantic media controller is to manage the plurality of independent resource modules.

20 Claims, 6 Drawing Sheets

MODULAR SERVER ARCHITECTURES

BACKGROUND

Despite continuous advances in data storage and computation, data access complexity continues to grow. Exponential data growth is overwhelming traditional solution architectures which cannot provision and power existing infrastructures and cannot afford to process all the data to make real-time decisions. Techniques required to scale data access may require more physical resources such as, computing units, storage units, etc., and even more hardware and software complexity. Thus, the complexity of server architectures having a Main Logic Board (MLB) with a plurality of devices mounted thereon for providing different services to the servers is becoming higher. In addition, these complex server architectures may imply high memory qualification and material costs.

DETAILED DESCRIPTION

Figure 1:
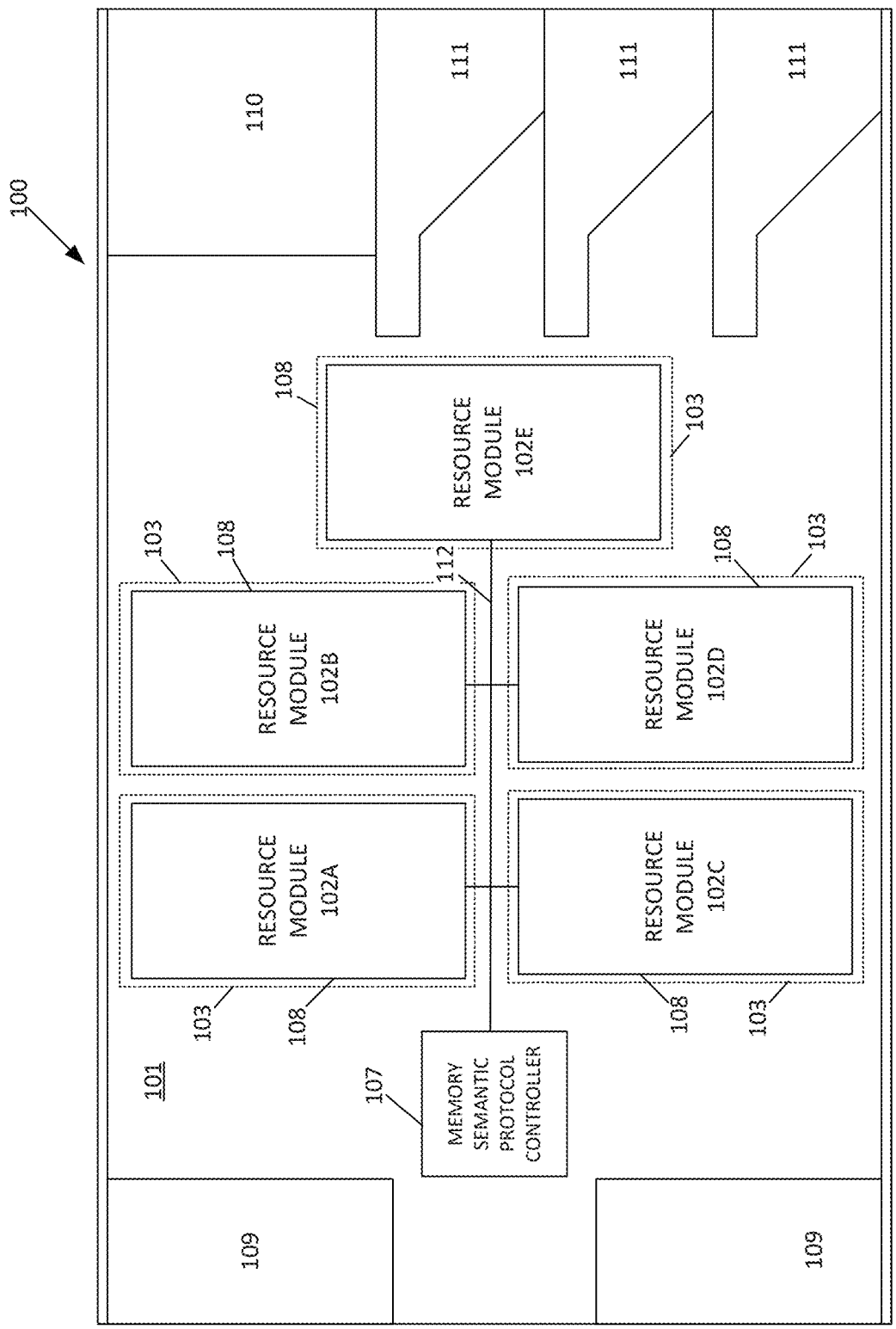
FIG. 1 is a top view of an example server implementing an example modular server architecture.

Examples disclosed herein refer to servers implementing modular server architectures that may comprise a server chassis, a plurality of physically independent resource modules releasably attached to the server chassis of a server and a memory semantic protocol controller connected to the plurality of independent resource modules. Each one of the resource modules has a physically independent and distinct Printed Circuit Board (PCB) that is mounted on the server chassis. The memory semantic protocol controller may be to manage the plurality of resource modules within the server. For example, the memory semantic protocol controller may be to manage data exchange between the plurality of resource modules and between the plurality of resource modules with other devices within the server chassis, such as connectors, ports, switches or pluggable networking devices, among others. These modular server architectures with memory semantic protocol controllers for managing the composable infrastructure allow memory semantic computing such as load store cache coherent functions over fabric. In some examples, the resource modules may be directly attached to the server chassis while in other examples the resource modules may be directly attached to a sub-enclosure which would be attached to the server chassis.

As used herein, a "resource module" may be a device comprising any combination of hardware and programming able to provide a particular service, such a computational service, storage service, data access service, power service, cooling service, etc., to the server. In some examples, the resource modules may be modules providing heterogeneous services to the server that may be selected from a group comprising processing units, memory expanders, memory devices, accelerator devices, cooling units, power units and combinations thereof. For example, the resource modules attached to a single server chassis may be any combination of processors, Solid State Drives (SSDs), Graphics Processor Units (GPUs), tensor processors devices, Field-Programmable Gate Arrays (FPGAs), spinning media devices, or any other module able to provide a service to data being managed by the server. In some other examples, the resource modules may be additional cooling units or power units to augment pre-existing cooling or power infrastructures, respectively.

As used herein, the "memory semantic protocol controller" may be any combination of hardware and programming to implement the functionalities of the controller described herein. A memory semantic protocol controller may refer to a controller that uses the process logic used to control access to shared memory locations, or at a higher level to shared variables in the presence of multiple threads or processors. In examples described herein, such combinations of hardware and programming may be implemented in a number of different ways. For example, the programming for controller may be processor executable instructions stored on at least one non-transitory machine-readable storage medium and the hardware for controller may include at least one processor to execute those instructions. In some examples, the at least one machine-readable storage medium may store instructions that, when executed by the at least one processing resource, at least partially implement the controller. In some examples, the functionalities of controller may be at least partially implemented in the form of electronic circuitry.

These modular server architectures, with releasable and interchangeable resource modules, enable a single server chassis to support different server designs. They also limit Stock Keeping Unit (SKU) proliferation since different server topologies can be mounted within the same server chassis by replacing the mounted resource modules and their connections with different resource modules and connections depending on the needs. Thus, server manufacturers do not need to have server chassis with multiple topologies on stock, but these topologies can be mounted on demand. Besides, users may modify the current configuration of a server by extracting a particular server chassis from the rack in which it is installed and replacing specific resource modules with different resource modules for providing different services. In addition, in the cases in which the resource modules include memory modules, by having different memory modules with distinct PCBs and being controlled by a single memory semantic protocol controller the number of different cpu/memory subsystems that need to be qualified is reduced. Thus, instead of having to qualify, i.e, validate reliability of the storage devices, of each server having a distinct and fixed inner architecture, by having servers implementing the modular architectures herein described resource modules implementing different cpu/memory resources previously qualified could be installed in the servers and leverage these subsystems for all the different workloads that the modular server architecture can be configured for.

In some examples, the memory semantic protocol controller may be a Gen-Z protocol controller. As used herein, "Gen-Z" refers to an interconnection protocol designed to provide memory semantic protocol access to data and devices via direct-attached, switched, or fabric topologies. Gen-Z protocol abstracts memory media to enable any type and mix of Dynamic Random Access Memory (DRAM) and Non-Volatile Memory (NVM) to be directly accessed by applications or through block-semantic communications. Therefore, the Gen-Z protocol controller may refer to a memory semantic protocol controller as previously described using Gen-Z protocol.

In some examples, the memory semantic protocol controller may be an Open Coherent Accelerator Processor Interface (OpenCAPI) protocol controller. As used herein, "OpenCAPI" refers to an interconnection protocol designed to allow any microprocessor to attach to coherent user-level accelerators and I/O devices and memories accessible via read/write or user-level DMA semantics. OpenCAPI protocol abstracts memory media to enable any type and mix of DRAM and NVM to be directly accessed by applications or through block-semantic communications. Therefore, the OpenCAPI protocol controller may refer to a memory semantic protocol controller as previously described using OpenCAPI protocol.

In some examples, the memory semantic protocol controller may be a CCIX protocol controller. As used herein, "CCIX" refers to an interconnection protocol designed to allow processors based on different instruction set architectures to extend the benefits of cache coherent, peer processing to a number of acceleration devices. CCIX protocol abstracts memory media to enable any type and mix of DRAM and NVM to be directly accessed by applications or through block-semantic communications. Therefore, the CCIX protocol controller may refer to a memory semantic protocol controller as previously described using CCIX protocol.

In some examples, the connections between the memory semantic protocol controller and the plurality of resource modules within the server chassis may be selected from a group comprising peer-to-peer connections, fabric connections and a combination thereof. For example, the memory semantic protocol controller may support point-to-point communications (communications between resource modules being Central Processing Units (CPUs) and memory devices), host-client communications as well as communications between fabric attached devices. One such communication may be between a memory component and a processor over a point to point connection. Another example may be a memory component communicating with a processor through a switch or router.

In some examples, the plurality of resource modules may be connected to each other and to the memory semantic protocol controller by high performance cables. By using high performance cables to interconnect the resource modules and the memory semantic protocol controller, the need for forward error correction and using retimers may be avoided. This is in contrast to approaches in which the memory modules are connected to the same single PCA, which may require forward error correction and retimers. By avoiding the use of forward error correction and retimers, the examples may reduce signal latency and costs. In some other examples, other elements for attaching the resource modules to each other and to the memory semantic protocol controller could be used, such as electrical connectors or wireless communication techniques.

In some examples, the cables may be attached to the plurality of resource modules by cable harnesses. This facilitates connecting and disconnecting the cables to the resource modules which in turn allows modifying the inner configuration of server by replacing part or all the resource modules in the server chassis.

In some examples, locations of the cables within the server chassis are configurable such that flexibility of the inner configuration is improved. Cables are flexible bodies that can be moved within the server chassis depending on the particular inner topology of the server.

In some examples, the resource modules attached to the server chassis may be releasably mounted on pre-defined module installation locations. As used herein, items being "releasably mounted" refer to items mounted on a main piece which are able to be released or separated from the main piece without destroying or damaging either the items, the main piece or the connection elements used for mounting the items on the main piece.

These pre-defined module installation locations can be used for any one of a number of different resource modules. Thus, instead of having to design a different chassis for each server architecture, the servers herein described allow creating different modular server architectures on the same server chassis by replacing some of the releasably resource modules with other resource modules and using the same pre-existing module installation locations and module mounting features. Each module installation location in the server chassis may have mounting features and the resource modules may also have corresponding mounting features that lock/unlock the mounting features of the server chassis such that the resource modules can be releasably attached to the server chassis. For example, the server chassis may comprise predefined mounting points at the predefined module installation locations to allow the resource modules to be attached. For example, the mounting points may be through holes or blind holes made in pre-defined locations in the server chassis to which the PCBs of the respective resource modules may be attached by bolts or screws. The PCBs of the resource modules may further comprise respective holes the bolts or screws pass through. Other elements that could be used for attaching the resource modules to the server chassis might be latches, clamps or any other tool-less mechanism placed in pre-defined locations in the server chassis.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples. In addition, implementations may include some or all of such example features in any combination (excluding logically inconsistent or mutually exclusive combinations); detailed descriptions and illustrations of all such combinations are omitted herein to simply the description.

Turning now to the figures, FIG. 1 shows a top view of an example server 100 that implements an example modular server architecture. It should be understood that the server 100 depicted in FIG. 1 may include additional components and that some of the components described herein may be removed and/or modified without departing from a scope of the server 100.

The server 100 according to the example modular server architecture comprises a server chassis 101, a plurality of physically independent resource modules 102 releasably and directly attached to the server chassis 101 and a memory semantic protocol controller 107 connected to the plurality of resource modules 102. Each one of the resource modules 102 has a physically independent and distinct Printed Circuit Board (PCB) 108 with one or more resources on it. The memory semantic protocol controller 107 is to manage the plurality of resource modules 102 within the server chassis 101. For example, the memory semantic protocol controller 107 may be to manage data exchange between the plurality of resource modules 102 themselves, and data exchange between the plurality of resource modules 102 and other devices within the server chassis 101, such as connectors, ports, switches or pluggable networking devices, among others.

According to the example modular server architecture, multiple distinct types or configurations of servers 100 may be constructed using the same modular building blocks. In particular, according to this architecture any particular server 100 may include up to a specified number N (N being 2 or more) of resource modules 102, with the resource modules 102 that are included therein being any combination of different types of resource modules 102. Each distinct type of resource module 102 includes a distinct combination of one or more resources. Specifically, each type of resource module 102 may include a specific combination of resources such as: processors, memory such as SSDs or NVMs, GPUs, tensor processors devices, FPGAs, memory expanders, spinning media devices, power units, cooling units, etc. For example, a first type of resource module 102 may include a CPU and memory, a second type of resource module 102 may include memory (without a CPU), a third type of resource module 102 may include a GPU, and so on.

As noted above, any combination of types of resource modules 102 may be used in the server 100. Thus, in some example servers 100 that are based on the architecture, all the resource modules 102 may be identical types, for example all the resource modules 102 may include SSDs as their resources. As another example, all the resource modules 102 may include flash memories as their resources. As another example, all the resource modules 102 may include memory expanders forming a storage pool as their resources. In some example servers 100, some or all of the mounted resource modules 102 may be different types. For example, the server 100 may include a first type of resource module 102 with a computing resource (e.g., CPU, FPGA, etc.) as its resource and a second type of resource module 102 with a storage unit for processing and storing data as its resource.

In some examples, each type of resource module 102 may be based on a common form factor (e.g., PCB size and shape, types and locations of mounting features, etc.) to fit to the pre-defined module installation locations in the server chassis 101. This helps to enable the free combination (i.e., mixing-and-matching) of different types of resource modules 102 within the same single type of chassis 101. In this context, a common form factor does not necessarily mean that each type of resource module 102 has identical form factors; rather, by common form factor it is meant that all types of the resource modules 102 are designed to fit within the chassis 101 in one or more of a number of predesignated mounting regions 103 (203), with the connection/mounting mechanisms of the resource module 102 being arranged to match corresponding connection/mounting mechanisms of the chassis 101 at the predesignated mounting regions 103. In some examples, some types of resource modules may be designed to take up an integer multiple of the predesignated mounting regions 103—for example, in the server of FIG. 3A, the resource block 302A is designed to take up two predesignated mounting regions (the mounting regions are not illustrated in FIG. 3A, but are arranged similar to the mounting regions 203 illustrated in FIG. 2).

The pre-defined mounting regions 103 are configured to be compatible with form factors of any resource module from a plurality of different types of resource modules. For example, the mounting points in the pre-defined mounting regions 103 are placed in correspondence with other mounting points in the resource modules 102. Some examples of mounting points may be holes or hold down points located in correspondence with corners of the form factors of the resource modules 102 for stable mounting.]

As shown in FIG. 1, the server chassis 101 comprises two rear housings or enclosures 109 that may comprise, for example, bays for mounting additional media or resource modules, hot pluggable rear connectors, power units, memories, etc. The server chassis 101 further comprises several front housings or bays 110-111 to insert switches, additional media or resource modules, front connectors, memories, etc. The memory semantic protocol controller 107 may be also connected (connections not shown in this figure) to the rear housings 109 and to the front housings 110-111 to manage data exchange between the plurality of independent resource modules 102 and the devices enclosed within these housings 109-111.

Figure 2:
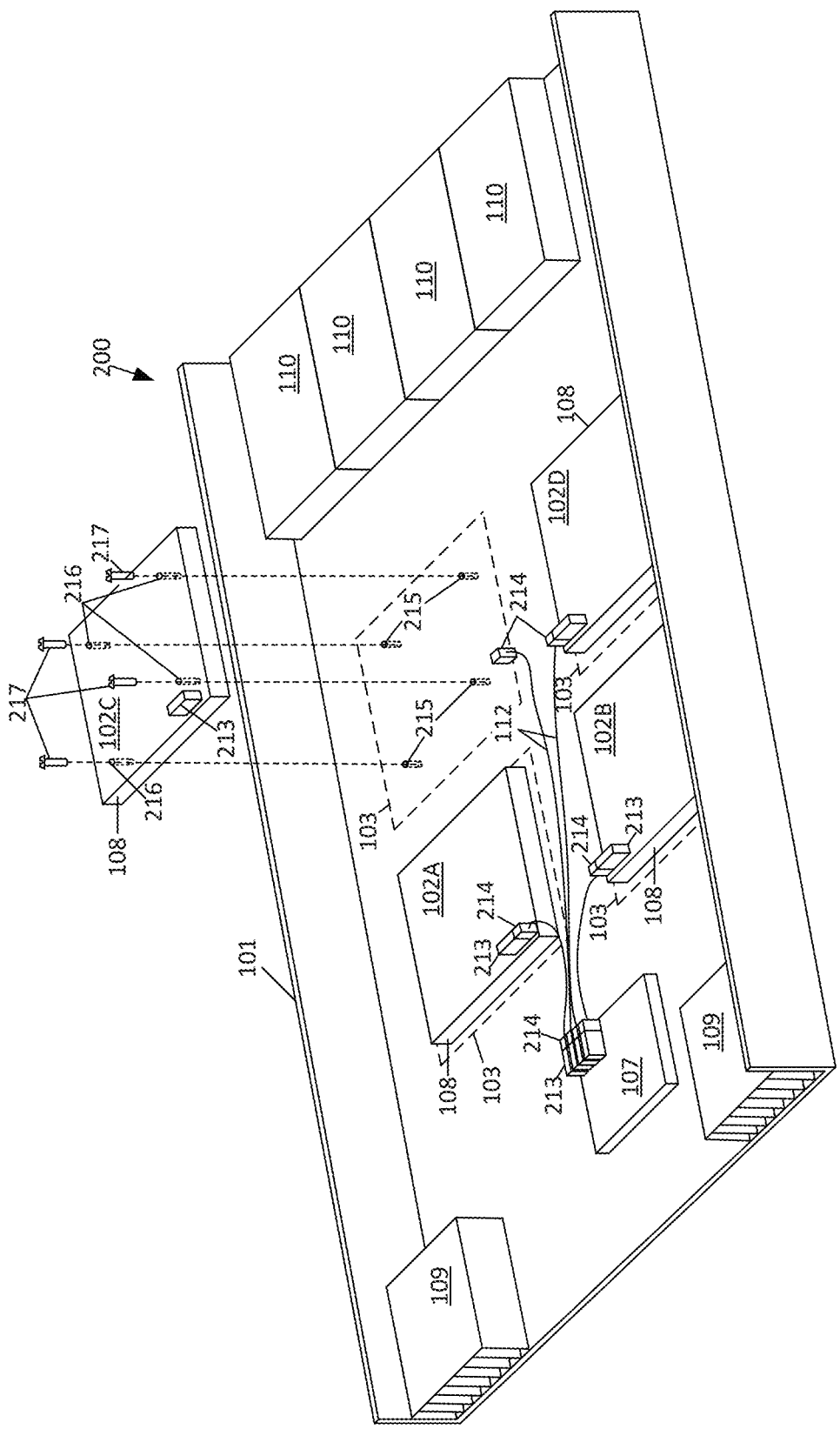
FIG. 2 is a perspective view an example server implementing an example modular server architecture with a memory semantic protocol controller.

As noted above, the chassis 101 may also include predetermined mounting regions 103 at which the resource modules 102 may be mounted. For example, the server 100 illustrated in FIG. 1 includes five predetermined mounting regions 103 in which five resource modules 102 are installed. As another example, FIGS. 2-3F illustrate various servers 100 with each including four predetermined mounting regions 103. In the examples of FIGS. 2-3F, the mounting regions 103 are arranged in a 2×2 grid pattern. Each mounting region 103 may include mounting features, such as clamps, holes for screws or bolts, latches, etc. The resource modules 102 may also comprise mounting features located in correspondence with the mounting features in the mounting regions 103 and that match these mounting features in the mounting regions 103. For example, the mounting regions 103 may comprise clamps or latches to retain the resource modules 102 in the pre-defined mounting regions 103. As another example, FIG. 2 shows mounting regions 103 comprising first holes 215 and the resource modules 102 comprising corresponding second holes 216 such as the resource modules 102 may be releasably attached to the server chassis 101 by respective screws or bolts 217 passing through the first and second holes 215-216. Any other attaching feature able to releasably mount the resource modules on the server chassis 101 may be used.

The server chassis 101 may mount a pre-existing cooling infrastructure (not shown in the figure) comprising cooling devices such as air cooling devices, for example a set of fans for dissipating heated air from the server chassis 101, or liquid cooling devices, for example heat receiving structures being cooled by a liquid flowing through sealed pipes, or a combination of air and liquid cooling devices.

The PCBs 108 of each resource module 102 further comprise circuitry (not shown in this figure) to electrically interconnect the different electric and electronic elements mounted on the respective PCBs 108.

As shown in FIG. 1, the memory semantic protocol controller 107 is an independent element mounted on a single System on Chip (SoC) and connected to the resource modules 102 by cables 112. In some other examples, the memory semantic protocol controller 107 may be integrated with computing components such as CPUs, GPUs, or Switch Application-Specific Integrated Circuits (ASICs) within a single SoC and also being connected to the resource modules 102 by cables 112.

The high performance cables 112 interconnect the resource modules 102 and the memory semantic protocol controller 107. These cables 112 are flexible such that their configuration can be modified within the server chassis 101. Thus, when the resource modules 102 are replace and the shape or dimension of the new resource modules 102 does not exactly fit with the shape or dimension of the resource modules 102 being replaced, the topology of the cables can be modified. The memory semantic protocol controller 107 may be also connected to the rear housings 109 and to the front housings 110-111 by high performance cables. As used herein, "high performance cables" refer to cables able to function at the highest data rates currently deployed in the industry such as 112 GT/s PAM4 and beyond.

The cables may be attached to the resource modules 102 and to the memory semantic protocol controller 107 by cable harnesses (not shown in this figure). This facilitates connecting and disconnecting the cables 112 to the resource modules 102 which in turn allows modifying the inner configuration of server by replacing part or all the resource modules in the server chassis.

While FIG. 1 depicts five resource modules 102 releasable mounted on the server chassis 101 of a server 100, different example servers constructed according to the example modular server architecture may include any number of resource modules 102 within the server chassis 101 depending on available space, mounting regions 103 and existing connections within the server.

FIG. 2 shows a perspective view another example server 200 according to the example modular server architecture. Certain features of the server 200 are similar to features of the server 100, and thus similar reference numbers are used for these features in FIG. 2. It should be understood that the server 200 depicted in FIG. 2 may include additional components and that some of the components described herein may be removed and/or modified.

Similar to the server 100, the server 200 comprises a server chassis 101, a plurality of independent resource modules 102 releasable and directly attached to the server chassis 101 and a memory semantic protocol controller 107 connected to the plurality of independent resource modules 102. In addition, in the server 200, the memory semantic protocol controller 107 is a Gen-Z protocol controller (hereinafter Gen-Z protocol controller 107), and there are four mounting regions 103. Each one of the resource modules 102 has an independent and distinct PCB 108. The Gen-Z protocol controller 107 is an independent element mounted on a single SoC and attached directly to the server chassis 101.

As described above, the chassis 101 may include mounting features in each mounting region 103 that are arranged to connect with any type of the resource modules 102. In some examples, the mounting features may include through holes in the chassis. For example, as illustrated in FIG. 2, the server chassis 101 may comprise first through holes 215 made in pre-defined locations in the server chassis 101 and the resource modules 102 may comprise respective through holes 216 in their PCBs 108 in correspondence with the first through holes 215 of the sever chassis 101. Respective screws 217 are inserted into the first and second through holes 215-216 to attach the resource modules 102 to the server chassis 101. In some other examples, instead of through holes, the server chassis 101 may implement latches, clamps or any other tool-less mechanism placed in pre-defined locations to releasable mount the resource modules 102 into the server.

The Gen-Z protocol controller 107 is connected to the resource modules 102 via flexible high performance cables 112. The cables 112 comprise respective end connectors 214 that are connected to corresponding connectors 213 in the Gen-Z protocol controller 207 and in the resource modules 102. The connectors 213-214 facilitate connecting and disconnecting the cables 112 to/from the resource modules 102 and the Gen-Z protocol controller 207, which in turn allow easily modifying the inner configuration of server by replacing part or all the resource modules 102 in the server chassis 101.

The Gen-Z protocol controller 107 is to manage the plurality of independent resource modules 102 within the server chassis 101. For example, the Gen-Z protocol controller 107 manages data exchange between the plurality of independent resource modules 102 and provides memory semantic protocol access to data and devices via direct-attached, switched, or fabric topologies. When the resource modules 102 are storage modules, such as DRAM and NVM, the Gen-Z protocol controller 107 abstracts memory media to enable any type and mix of DRAM and NVM to be directly accessed by applications or through block-semantic communications.

As shown in FIG. 2, the server chassis 101 further comprises two rear housings 109 that may comprise, for example, bays for mounting additional media or resource modules. The server chassis 101 further comprises four front housings 110 to insert switches, additional media or resource modules, front connectors, memories, etc. The Gen-Z protocol controller 107 may be also connected to the rear housings 109 and to the front housings 110 to manage data exchange between the resource modules 102 and the devices enclosed within these housings 109-110.

FIGS. 3A-F are top views of a plurality of example servers 300A-F according the example modular server architectures having different combinations of resource modules 102. It should be understood that the servers 300A-F depicted in FIGS. 3A-3F may include additional components and that some of the components described herein may be removed and/or modified.

FIGS. 3A-F show a plurality of different servers 300A-F that are formed by combining a common server chassis 101 according to an example modular server architecture with different combinations of types of resource modules 102 according to the example modular server architecture. Certain features of the servers 300A-F are similar to features of the server 100, and thus similar reference numbers are used for these features in FIGS. 3A-F. Similar to the server 100, the servers 300A-F each include a memory semantic protocol controller 107, two rear housings 109 for mounting additional media or resource modules and front housings 310-311 to store switches, additional media or resource modules, front connectors, memories, etc. In the example servers 300A-F, there are three front housings 310-311, and these are mounted on a common PCB 318 that is attached to the server chassis 101. In the example servers 300A-F, the common server chassis 101 also has a cooling module 319 that may comprise air cooling devices, for example a set of fans placed in a row, for dissipating heated air from the server chassis 101. In some examples, the memory semantic protocol controller 107 is a Gen-Z protocol controller. The memory semantic protocol controller 107 is connected (connections not shown in this figure) to the plurality of resource modules 102, to the rear housings 109 to the front housings 110-111 and to the cooling module 319.

Figure 3A:
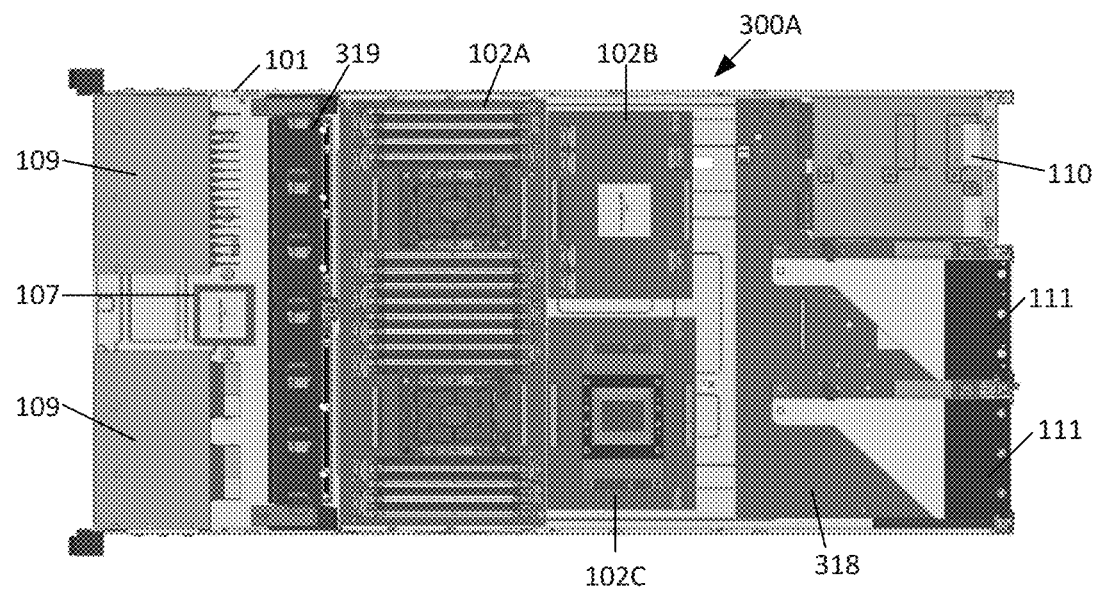
FIGS. 3A-F are top views of a plurality of servers implementing example modular server architectures having different combinations of resource modules.

FIG. 3A shows a particular server 300A comprising three resource modules 102. In particular, resource module 102A in FIG. 3A includes a memory expander comprising a plurality of memory connector for inserting pluggable memories, for example SSDs or NVMs. Resource module F102B in FIG. 3A includes a FPGA accelerator and resource module 102C in FIG. 3A includes a GPU.

Figure 3B:
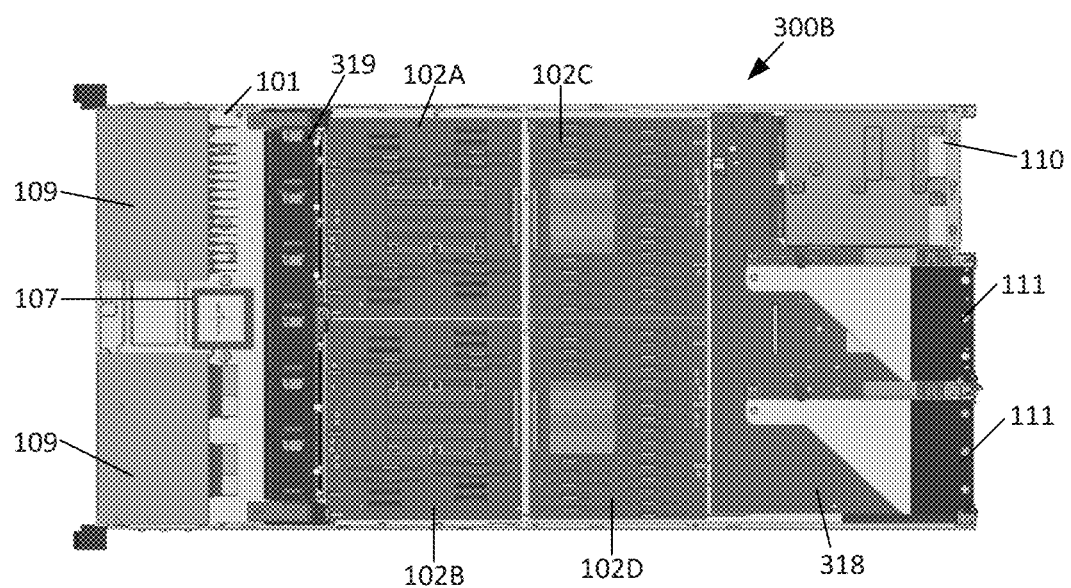

FIG. 3B shows a particular server 300B comprising four resource modules 102. In particular, resource modules 102A-102B in FIG. 3B include Dual-RAS Dual Inline Memory Modules (DDIMM) and resource modules 102C-102D in FIG. 3B include DDIM/Flash expanders for inserting additional memory resources.

Figure 3C:
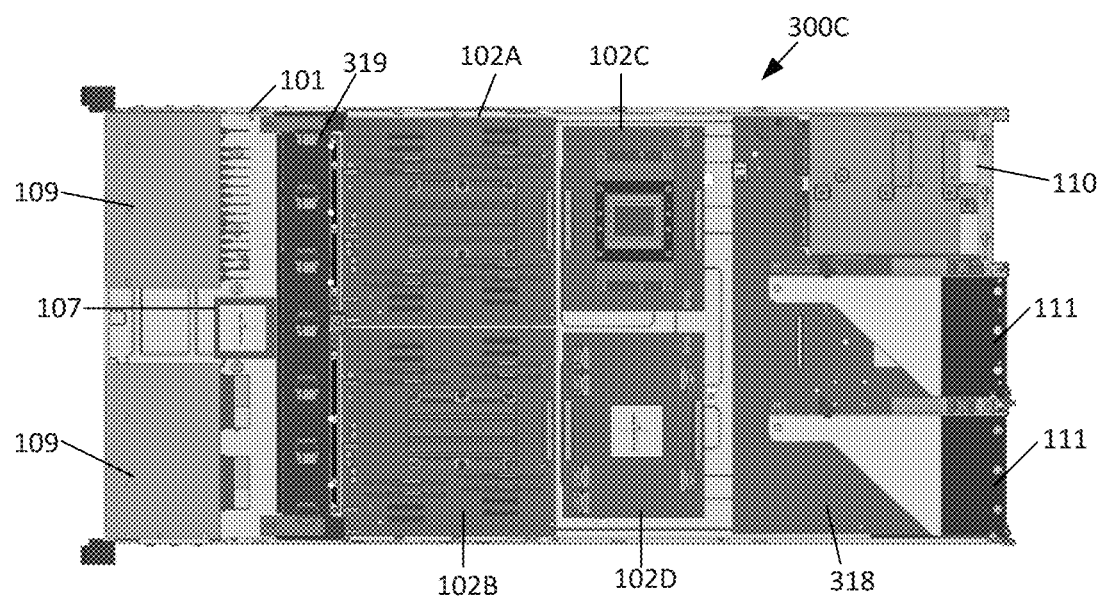

FIG. 3C shows a particular server 300C comprising four resource modules 102. In particular, resource modules 102A-102B in FIG. 3C include DDIMM, resource module 102C in FIG. 3C includes a GPU and resource module 102D in FIG. 3D includes a FPGA accelerator.

Figure 3D:
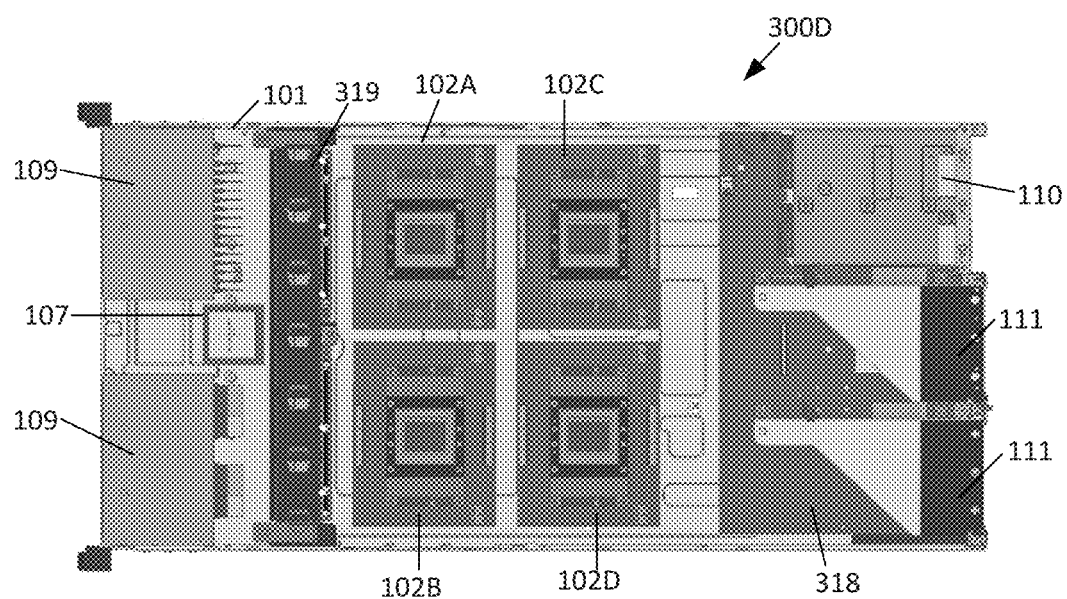

FIG. 3D shows a particular server 300D comprising four resource modules 102. Each resource module 102A-D in FIG. 3D includes a GPUs so this server 300D functions as a computing pool.

Figure 3E:
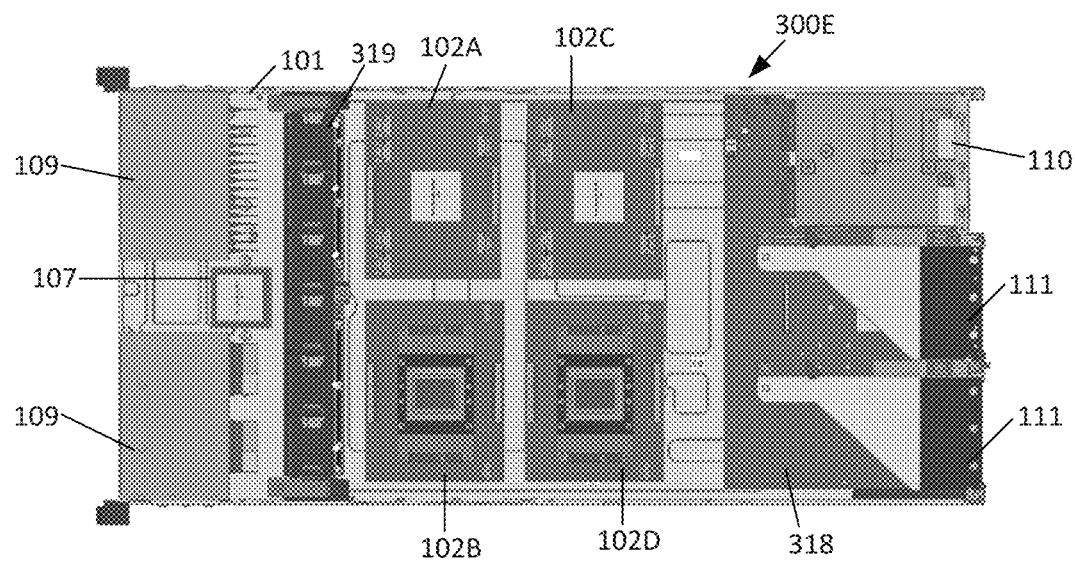
Figure 3F:
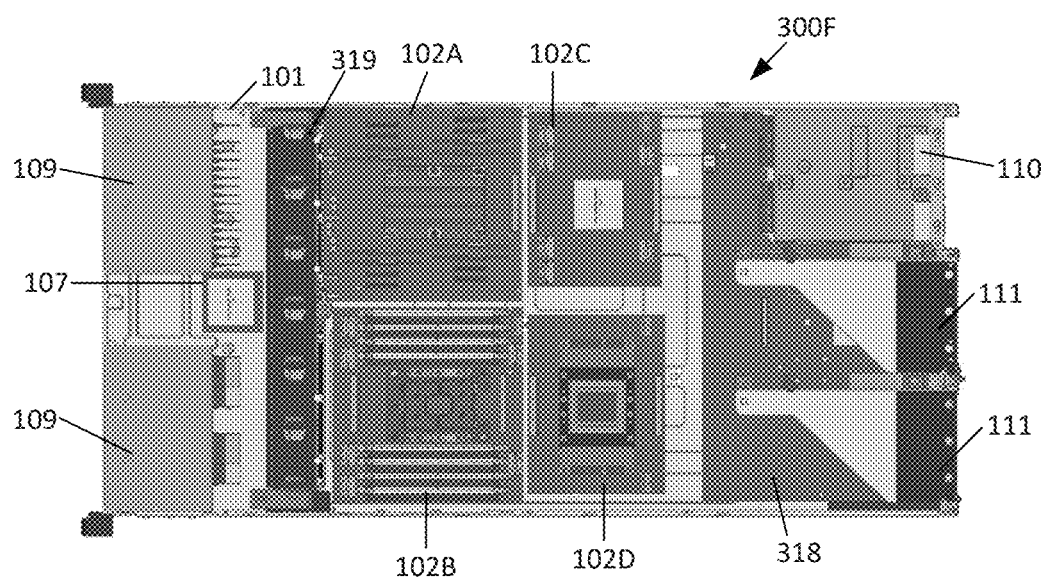

FIG. 3E shows a particular server 300E comprising four resource modules 102. In particular, resource modules 102A and 102C in FIG. 3E include FPGA accelerators and resource modules 102B and 102D in FIG. 3E include GPUs.

FIG. 3F shows a particular server 300F comprising four resource modules 102. In particular, resource module 102A in FIG. 3F includes a DDIM/Flash expander, resource module 120B in FIG. 3F includes a DDIMM, resource module 102C in FIG. 3F includes a FPGA accelerator and resource module 102D in FIG. 3F includes a GPU.

All the servers 300A-F use a common server chassis 101 having pre-defined module installation locations (mounting regions 103) to which the different resource modules are attached. Therefore, the modular server architecture herein described allows having different inner topologies using a single common server chassis 101.

Figure 4:
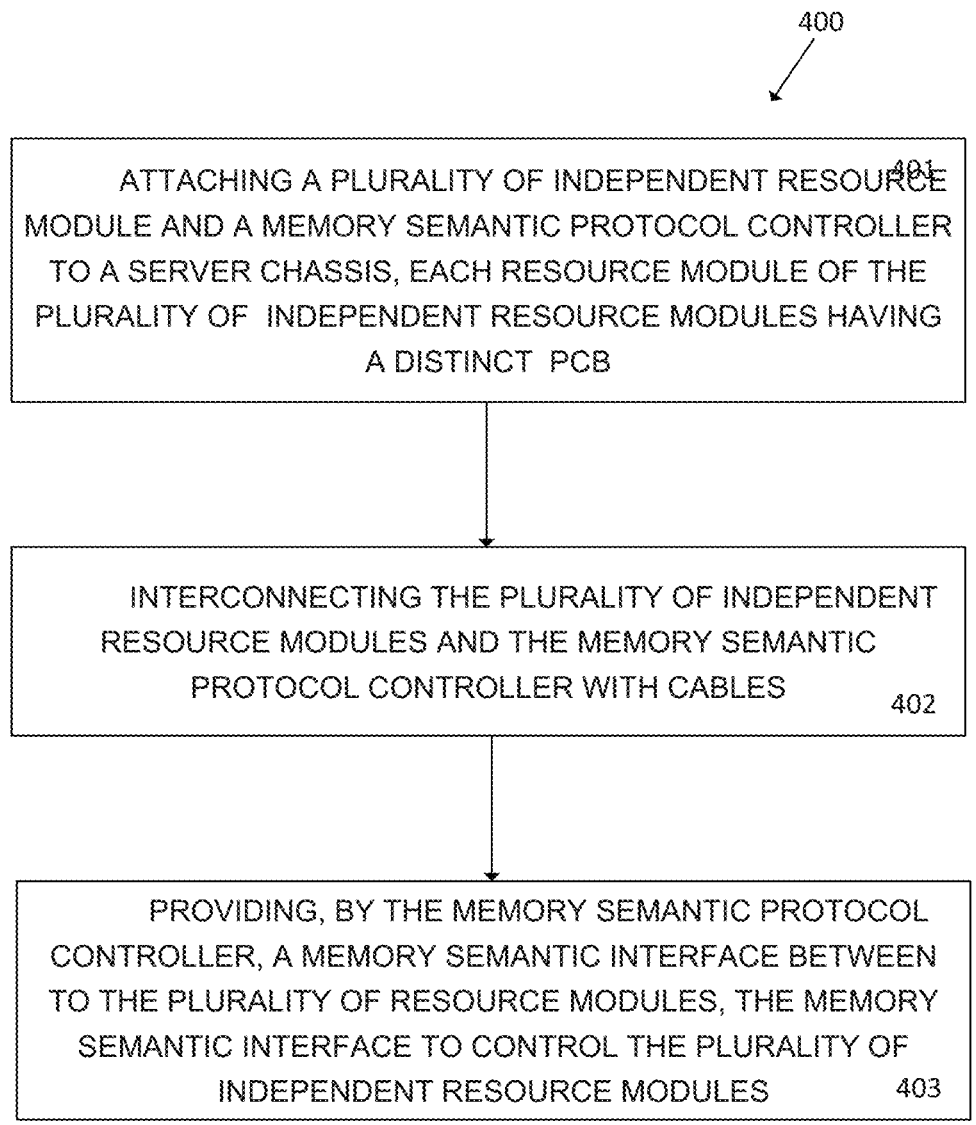
FIG. 4 is a flowchart of an example method for manufacturing a server with an example modular architecture.

FIG. 4 is a flowchart of an example method 400 for manufacturing a server with modular architecture. Although execution of method 400 is described below with reference to the modular server architecture 100 of FIG. 1, other suitable devices and systems for the execution of method 400 may be utilized. Additionally, implementation of method 400 is not limited to such examples.

At 401 of the method 400 a plurality of physically independent resource modules 102 and a memory semantic protocol controller 107 are mounted on a server chassis 101 of a server 100. Each resource module 102 has an independent and distinct PCB 108.

At 402 of the method 400, the plurality of independent resource modules 102 and the memory semantic protocol controller 107 are interconnected with high performance cables 112.

At 403 of the method 400, the memory semantic protocol controller 107 provides a memory semantic protocol interface between to the plurality of resource modules 102. The memory semantic protocol interface controls the plurality of independent resource modules 102. This memory semantic protocol interface allows the resource modules 102 to use the process logic used to control access to shared memory locations, or at a higher level to shared variables in the presence of multiple threads or processors.

In some examples, the memory semantic protocol controller 107 is one of a Gen-Z protocol controller, an OpenCAPI protocol controller and a CCIX protocol controller.

In some examples, the connections between the memory semantic protocol controller 107 and the plurality of independent resource modules 102 are one of peer-to-peer connections, fabric connections and a combination thereof.

In some examples, the method 400 comprises identifying a desired resource configuration for the server 100 and selecting a plurality of independent resource modules 102 from among a plurality of different types of resource modules 102 based on the directed resource configuration, each of the types of resource module 120 including a different combination of one or more resources.

In some examples, the memory semantic protocol controller 107 manages data exchange between the plurality of resource modules 102 and between the plurality of resource modules 102 with other devices, for example the rear housings 109 and the front housings 110-111, within the server chassis 101.

In some examples, the method 400 comprises attaching the flexible cables 112 to the plurality of resource modules 102 using cable harnesses. The location of the cables 112 within the server chassis 101 is configurable such that their location within the server chassis 101 can be modified to fit to the particular modular server architecture.

In some examples, the method 400 comprises selecting the resource modules 102 from a group comprising processing units, memory expanders, memory devices, accelerator devices, and combinations thereof.

In some examples, the method 400 comprises releasable mounting the resource modules 102 on pre-defined module installation locations 103 in the server chassis 101.

All of the features disclosed in this specification (including any accompanying claims, abstract and drawings), and/or all of the elements of any method or process so disclosed, may be combined in any combination, except combinations where at least some of such features and/or elements are mutually exclusive.

Furthermore, relative terms used to describe the structural features of the figures illustrated herein are in no way limiting to conceivable implementations. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements.

The invention claimed is:

1. A server formed according to a modular server architecture, comprising:
    a server chassis including a number of pre-defined mounting regions;
    a plurality of independent resource modules, wherein each resource module includes a distinct Printed Circuit Board (PCB) and wherein each resource module mechanically attaches to one of the pre-defined mounting regions via the PCB; and
    a memory semantic protocol controller connected to the plurality of independent resource modules, wherein the memory semantic protocol controller is to manage the plurality of independent resource modules and wherein the plurality of independent resource modules are communicatively and electrically connected to each other and to the memory semantic protocol controller by cables.

2. The server of claim 1, wherein the memory semantic protocol controller is a Gen-Z protocol controller.

3. The server of claim 1, wherein the memory semantic protocol controller is an Open Coherent Accelerator Processor Interface (OpenCAPI) protocol controller.

4. The server of claim 1, wherein the memory semantic protocol controller is a Cache Coherent Interconnect for Accelerators (CCIX) protocol controller.

5. The server of claim 1, wherein the memory semantic protocol controller is integrated with a computing resource.

6. The server of claim 1, wherein connections between the memory semantic protocol controller and the plurality of independent resource modules are one of: peer-to-peer connections, fabric connections and a combination thereof.

7. The server of claim 1, wherein the memory semantic protocol controller is to manage data exchange between the plurality of independent resource modules and between the plurality of independent resource modules with other devices within the server chassis.

8. The server of claim 1, wherein the cables are attached to the plurality of independent resource modules by cable harnesses.

9. The server of claim 1, wherein the resource modules each include one or more resources selected from a group comprising processing units, memory expanders, memory devices, accelerator devices, and combinations thereof.

10. The server of claim 1, wherein the resource modules are releasable mounted on pre-defined module installation locations in the server chassis.

11. The server of claim 10, wherein the resource modules are based on a common form factor to fit to the pre-defined module installation locations.

12. The server of claim 10, wherein the pre-defined mounting locations are configured to be compatible with any resource module from a plurality of different types of resource modules.

13. A method for manufacturing a server according to a modular server architecture, the method comprising:
Mechanically attaching a plurality of independent resource modules and a memory semantic protocol controller to pre-defined mounting regions on a basepan of a server chassis, each resource module of the plurality of independent resource modules having a distinct Printed Circuit Board (PCB), wherein the resource modules are attached to the server chassis via a retention mechanism included on the PCB; and
interconnecting the plurality of independent resource modules and the memory semantic protocol controller with cables; and
providing, by the memory semantic protocol controller, a memory semantic protocol interface between to the plurality of resource modules, the memory semantic protocol interface to control the plurality of independent resource modules.

14. The method of claim 13, wherein the memory semantic protocol controller is one of: a Gen-Z protocol controller, an Open Coherent Accelerator Processor Interface (OpenCAPI) protocol controller and a Cache Coherent Interconnect for Accelerators (CCIX) protocol controller.

15. The method of claim 13, wherein the connections between the memory semantic protocol controller and the plurality of independent resource modules are one of: peer-to-peer connections, fabric connections and a combination thereof.

16. The method of claim 13, comprising:
identifying a desired resource configuration for the server; and
selecting the plurality of independent resource modules from among a plurality of different types of resource modules based on the desired resource configuration, each of the types of resource module including a different combination of one or more resources.

17. The method of claim 13, comprising attaching the cables to the plurality of resource modules using cable harnesses.

18. The method of claim 13, comprising selecting the resource modules from a group comprising processing units, memory expanders, memory devices, accelerator devices, and combinations thereof.

19. The method of claim 13, comprising releasably mounting the resource modules on pre-defined module installation locations in the server chassis.

20. The method of claim 13, wherein the retention mechanism is a screw or bolt.

* * * * *